(12) United States Patent
Rana

(10) Patent No.: US 10,250,133 B2
(45) Date of Patent: Apr. 2, 2019

(54) SINGLE-STAGE CMOS-BASED VOLTAGE QUADRUPLER CIRCUIT

(71) Applicant: STMicroelectronics International N.V., Schiphol (NL)

(72) Inventor: Vikas Rana, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/652,447

(22) Filed: Jul. 18, 2017

(65) Prior Publication Data

US 2019/0028024 A1 Jan. 24, 2019

(51) Int. Cl.
*H02M 3/07* (2006.01)
*H03K 3/356* (2006.01)

(52) U.S. Cl.
CPC ........ *H02M 3/07* (2013.01); *H03K 3/356104* (2013.01)

(58) Field of Classification Search
CPC ................... H02M 3/07; H02M 3/073; H02M 2003/075–2003/077
See application file for complete search history.

(56) References Cited

U.S. PATENT DOCUMENTS

| | | | | |
|---|---|---|---|---|
| 4,271,461 A * | 6/1981 | Hoffmann | ................ | H02M 3/07 327/535 |
| 5,508,971 A * | 4/1996 | Cernea | .................... | G11C 16/16 365/185.14 |
| 5,521,547 A * | 5/1996 | Tsukada | .................. | G05F 3/205 327/537 |
| 5,943,226 A * | 8/1999 | Kim | ...................... | H02M 3/073 327/537 |
| 6,208,196 B1 * | 3/2001 | St. Pierre | ................ | H02M 3/07 327/536 |
| 6,995,603 B2 * | 2/2006 | Chen | ..................... | H02M 3/073 327/536 |
| 7,436,241 B2 * | 10/2008 | Chen | ..................... | H02M 3/073 327/536 |
| 8,604,868 B2 * | 12/2013 | Ucciardello | ......... | H03K 17/102 327/333 |
| 2009/0219077 A1 * | 9/2009 | Pietri | .................... | H02M 3/073 327/536 |
| 2010/0244935 A1 * | 9/2010 | Kim | ...................... | G11C 5/145 327/536 |
| 2011/0285455 A1 * | 11/2011 | Kok | ..................... | H02M 3/073 327/536 |

* cited by examiner

*Primary Examiner* — Thomas J. Hiltunen
(74) *Attorney, Agent, or Firm* — Crowe & Dunlevy

(57) ABSTRACT

A single stage voltage quadrupler circuit includes a first capacitive voltage boosting circuit responsive to a first clock signal and operable to boost a voltage at a first node in response to the first clock signal from a first voltage level to a second voltage level that is substantially two times the first voltage level. A pass transistor selectively passes the boosted voltage at the first node to a second node in response to a control signal generated by a bootstrapping capacitor circuit in response to the level shifted first clock signal. A second capacitive boosting circuit is operable to boost the voltage at the second node in response to a level shifted second clock signal that is the logical invert of the level shifted first clock signal to third voltage level that is substantially four times the first voltage level.

52 Claims, 3 Drawing Sheets

SINGLE-STAGE CMOS-BASED VOLTAGE QUADRUPLER CIRCUIT

TECHNICAL FIELD

The present invention relates to a single-stage charge pump circuit configured to perform a quadrupling of an input voltage Vin (i.e., produce an output voltage Vout≈4*Vin).

BACKGROUND

A positive voltage charge-pump is a DC-DC voltage converter that operates to convert an input voltage to an output voltage having a magnitude that is higher than the input voltage. The input is, in many instances, a supply voltage for a circuit. Such charge pump circuits typically use capacitors as energy storage devices. The capacitors are switched in such a way that the desired voltage conversion occurs.

Charge pumps are useful in many different types of circuits, including low-voltage circuits, dynamic random access memory circuits, switched-capacitor circuits, EEPROM's and transceivers. In non-volatile memories, for example, charge-pumps are critical because they are used to generate the high voltages necessary to perform program and erase operations.

A charge pump circuit typically includes a basic building block referred to as a "voltage doubler" circuit. The voltage doubler circuit takes a DC input voltage (VIN) and generates an output voltage VOUT that is substantially equal to double the input voltage (i.e., 2*VIN), where "substantially equal" means at or nearly the same voltage within a tolerance range (generally less than a few percent) that is dependent voltage drop (or charge loss) across parasitic capacitances and output current load. By cascading N such voltage doubler circuit stages in series, a final output voltage that can be produced that is substantially equal to (N+1)*VIN.

An example of a prior art voltage doubler circuit 10 stage is shown in FIG. 1. This circuit 10 is commonly referred to in the art as a CMOS latch-based voltage doubler. The circuit 10 includes a latch circuit formed by two cross-coupled CMOS inverter circuits 12 and 14. The source terminals of the n-channel MOS transistors of the latch circuit are connected to an input node A (receiving the input voltage VIN) and the source terminals of the p-channel MOS transistors of the latch circuit are connected to an output node B (generating the output voltage VOUT). A capacitor C is coupled to each pair of connected drain terminals of the CMOS transistors of the latch circuit. A first capacitor coupled to inverter circuit 12 is configured to receive a clock signal CK and a second capacitor coupled to inverter circuit 14 is configured to receive a clock signal CKN (which is a logical inversion of the clock signal CK). Operation of this circuit 10 in response to the clock signals CK and CKN to double the input voltage is well known to those skilled in the art.

A voltage quadrupler circuit can be made by cascading three such voltage doubler circuit 10 stages in series as shown in FIG. 2 to produce a final output voltage VOUT that is substantially equal to 4*VIN. In comparison to other prior art cascaded circuits, the circuit of FIG. 2 advantageously does not exhibit a threshold voltage drop across the connected stages of the charge pump. Furthermore, the circuit requires just the two clock phases (CK and CKN) as applied to all stages. However, there are a number of known drawbacks including:

1) As N increases, for example when N=3 for a voltage quadrupler as in FIG. 2, the three cascaded circuit 10 stages occupy a significantly large amount of circuit area, especially due to the presence of six capacitors C whose occupied area is significant and dominates the overall area occupied by the circuit. The capacitance of each capacitor C is selected dependent on a number of different parameters including operating frequency, output current load, output capacitive load and ramp-up time of the charge pump. In general, the capacitance of each capacitor C included in the circuit is the same, and thus the overall occupied capacitor area is six times the area required for one capacitor.

2) Also, there is some charge loss across the CMOS transistor switches from one circuit stage to another circuit stage during the charge pumping operation. As an example, with an input voltage VIN=2V, the output voltages at the first, second and third voltage doubler circuit 10 stages may equal 3.96V, 5.92V and 7.89V, respectively, with the difference of 0.11V in the substantially equal output voltage representing a percentage or offset of 1.4% from the ideal 8V output voltage.

There is accordingly a need in the art for a voltage quadrupler circuit that can be used to generate an output voltage substantially equal to four times the input voltage and which occupies a reduced circuit area in comparison to prior art multi-stage cascaded charge pumps.

SUMMARY

In an embodiment, a circuit comprises: a first transistor having a source-drain path coupled between a voltage input node and a first node; a first boost capacitor having a first plate coupled to the first node and a second plate coupled to receive a first clock signal; a first level shifting circuit configured to receive the first clock signal and output a level shifted first clock signal; a second level shifting circuit configured to receive a second clock signal that is a logical invert of the first clock signal and output a level shifted second clock signal; a second transistor having a source-drain path coupled between the voltage input node and a second node; a first bootstrapping capacitor having a first plate coupled to the second node and a second plate coupled to receive the level shifted first clock signal; a third transistor having a source-drain path coupled between the first node and a third node, said third transistor having a gate controlled by a first control signal at the second node; and a second boost capacitor having a first plate coupled to the third node and a second plate coupled to receive the level shifted second clock signal.

In an embodiment, a circuit comprises: a first level shifting circuit configured to receive a first clock signal and output a level shifted first clock signal; a second level shifting circuit configured to receive a second clock signal and output a level shifted second clock signal, wherein the second clock signal is a logical invert of the first clock signal; a first voltage boosting circuit including a first capacitor having a first plate directly connected to a first node and a second plate coupled to receive the first clock signal, said first voltage boosting circuit configured to boost a voltage at the first node in response to the first clock signal from a first voltage level to a second voltage level that is substantially equal to two times the first voltage level; a first pass transistor configured to selectively pass the boosted voltage at the first node to a second node in response to a first control signal generated in response to the level shifted first clock signal; and a second voltage boosting circuit including a second capacitor having a first plate directly connected to the second node and a second plate coupled to receive the level shifted second clock signal, said second voltage boosting circuit configured to boost a voltage at the second node in response to the level shifted second clock signal from the second voltage level to a third voltage level that is substantially equal to two times the second voltage level.

BRIEF DESCRIPTION OF THE DRAWINGS

For a better understanding of the embodiments, reference will now be made by way of example only to the accompanying figures in which.

DETAILED DESCRIPTION

Figure 3:
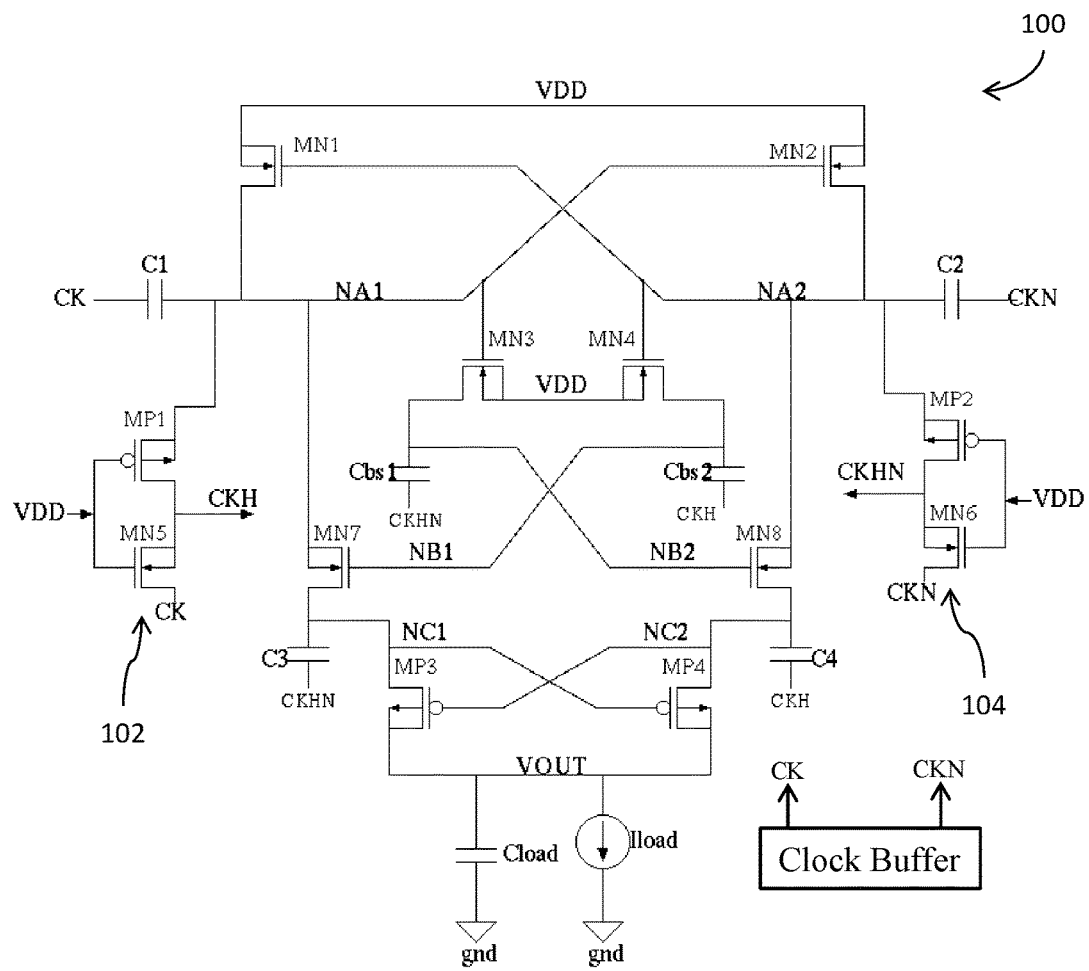
FIG. 3 is a circuit of a single stage voltage quadrupler circuit.

Reference is now made to FIG. 3 showing a circuit diagram for a voltage quadrupler circuit 100. The circuit 100 includes an n-channel MOS transistor MN1 having a source terminal coupled to a supply voltage node VDD and a drain terminal coupled to node NA1 (i.e., the source-drain path of the transistor is coupled between VDD and NA1) and an n-channel MOS transistor MN2 having a source terminal coupled to the supply voltage node VDD and a drain terminal coupled to node NA2. The transistors MN1 and MN2 are cross-coupled with the gate terminal of transistor MN1 coupled to the drain terminal of transistor MN2 at node NA2 and the gate terminal of transistor MN2 coupled to the drain terminal of transistor MN1 at node NA1.

The circuit 100 further includes an n-channel MOS transistor MN3 having a source terminal coupled to the supply voltage node VDD and a drain terminal coupled to node NB2 and an n-channel MOS transistor MN4 having a source terminal coupled to the supply voltage node VDD and a drain terminal coupled to node NB1. The gate terminal of transistor MN3 is coupled to node NA1 and the gate terminal of transistor MN4 is coupled to node NA2.

The circuit 100 further includes an n-channel MOS transistor MN7 having a source terminal coupled to node NA1 and a drain terminal coupled to node NC1 and an n-channel MOS transistor MN8 having a source terminal coupled to node NA2 and a drain terminal coupled to node NC2. The gate terminal of transistor MN7 is coupled to node NB1 and the gate terminal of transistor MN8 is coupled to node NB2.

The circuit 100 further includes a p-channel MOS transistor MP3 having a drain terminal coupled to node NC1 and a source terminal coupled to a voltage output node VOUT and a p-channel MOS transistor MP4 having a drain terminal coupled to node NC2 and a source terminal coupled to the voltage output node VOUT. The transistors MP3 and MP4 are cross-coupled with the gate terminal of transistor MP3 coupled to the drain terminal of transistor MP4 at node NC2 and the gate terminal of transistor MP4 coupled to the drain terminal of transistor MP3 at node NC1.

The voltage output node VOUT may be coupled to a circuit load that is equivalently represented in FIG. 3 by a load capacitance Cload and a load current Iload coupled between the voltage output node VOUT and ground. The magnitude of the voltage generated at the voltage output node VOUT is substantially equal to four times voltage at the supply voltage node VDD.

Figure 4:
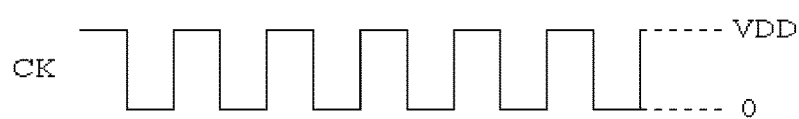
FIGS. 4-8 show signal waveforms for clocks and nodes of the FIG. 3 circuit.
Figure 4:
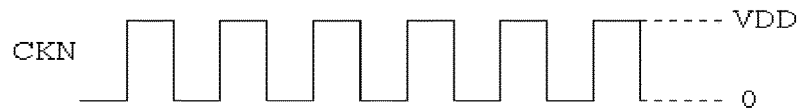

A capacitor C1 has one terminal coupled to node NA1 and another terminal coupled to receive a clock signal CK. A capacitor C2 has one terminal coupled to node NA2 and another terminal coupled to receive a clock signal CKN (which is a logical inversion of the clock signal CK). The voltage waveforms for the clock signals CK and CKN are shown in FIG. 4.

Figure 5:
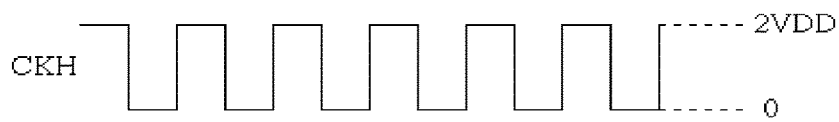
Figure 5:
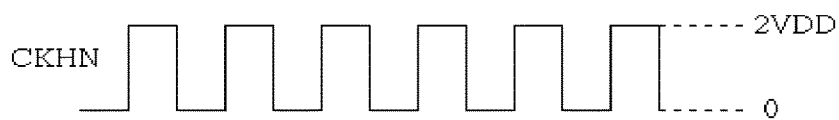

A bootstrapped capacitor Cbs1 has one terminal coupled to node NB2 and another terminal coupled to receive a clock signal CKHN. A bootstrapped capacitor Cbs2 has one terminal coupled to node NB1 and another terminal coupled to receive a clock signal CKH (which is a logical inversion of the clock signal CKHN). A capacitor C3 has one terminal coupled to node NC1 and another terminal coupled to receive a clock signal CKHN. A capacitor C4 has one terminal coupled to node NC2 and another terminal coupled to receive a clock signal CKH. The voltage waveforms for the clock signals CKH and CKHN are shown in FIG. 5.

The bootstrapped capacitors Cbs1 and Cbs2 are comparatively much smaller than the capacitors C1-C4, having capacitance values large enough to generate signals of sufficient magnitude to drive the gates of transistors MN7 and MN8. As an example, each of the bootstrapped capacitors Cbs1 and Cbs2 may have a capacitance value of about 10% of the capacitance value of each of the capacitors C1-C4. Thus, each of the bootstrapped capacitors Cbs1 and Cbs2 occupies a substantially smaller circuit area than each of the capacitors C1-C4. Generally speaking, the circuit area occupied by the capacitors C1-C4 dominates and the overall area occupied by capacitors for the circuit is slightly larger than four times the area occupied by one of the capacitors C1-C4, and thus is substantially less than the total occupied area of the six capacitors of the prior art cascade circuit of FIG. 2.

A CMOS inverter 102 has an input coupled to the supply voltage node VDD and an output generating the clock signal CKH. A source terminal of the p-channel MOS transistor in inverter 102 is coupled to the node NA1 and a source terminal of the n-channel MOS transistor in inverter 102 is coupled to receive the clock signal CK.

A CMOS inverter 104 has an input coupled to the supply voltage node VDD and an output generating the clock signal CKHN. A source terminal of the p-channel MOS transistor in inverter 104 is coupled to the node NA2 and a source terminal of the n-channel MOS transistor in inverter 104 is coupled to receive the clock signal CKN.

The CMOS inverters 102 and 104 function as a clock level shifting circuit. FIG. 4 shows the waveforms for the clock signals CK and CKN. FIG. 5 shows the waveforms for the clock signals CKH and CKHN. It will be noted that the high voltage level of the clock signals CKH and CKHN is substantially equal to 2*VDD, with the high voltage level of the clock signals CK and CKN being VDD. The clock signals CKH and CKHN have a same phase as the clock signals CK and CKN, respectively.

The voltage quadrupler circuit 100 advantageously operates from just two clocks (CK/CKH and CKN/CKNH) and is implemented as a single operating stage.

In this configuration, the capacitor C1 and transistor MN1 form a voltage boosting circuit operable to boost a voltage at node NA1 from VDD to 2*VDD in response to the clock signal CK and a control signal at the gate of transistor MN1 which is dependent on the clock signal CKN (and a boosted voltage at node NA2). Similarly, the capacitor C2 and transistor MN2 form a voltage boosting circuit operable to boost a voltage at node NA2 from VDD to 2*VDD in response to the clock signal CKN and a control signal at the gate of transistor MN2 which is dependent on the clock signal CK (and a boosted voltage at node NA1).

The transistor MN7 functions as a pass transistor device that selectively passes the boosted voltage at node NA1 to node NC1 in response to a control signal generated at node NB1. A control circuit formed by transistor MN4 and bootstrapping capacitor Cbs2 generates the control signal at node NB1 in response to clock signal CKH and the control signal at node NA2. This control circuit is also a voltage boosting circuit which boosts the voltage at node NB1 from VDD to 2*VDD in response to the clock signal CKH in order to generate sufficient drive to turn on pass transistor MN7.

Similarly, the transistor MN8 functions as a pass transistor device that selectively passes the boosted voltage at node NA2 to node NC2 in response to a control signal generated at node NB2. A control circuit formed by transistor MN3 and bootstrapping capacitor Cbs1 generates the control signal at node NB2 in response to clock signal CKHN and the control signal at node NA1. This control circuit is also a voltage boosting circuit which boosts the voltage at node NB2 from VDD to 2*VDD in response to the clock signal CKHN in order to generate sufficient drive to turn on pass transistor MN8.

The capacitor C3 forms another voltage boosting circuit operable to boost a voltage at node NC1 from 2*VDD to 4*VDD in response to the clock signal CKHN. This boost operation occurs when the control signal at node NB1 turns off pass transistor MN7 to isolate node NC1 from node NA1. The transistor MP3 functions as another pass transistor device to pass the boosted voltage at node NC1 to the output voltage node VOUT.

The capacitor C4 forms another voltage boosting circuit operable to boost a voltage at node NC2 from 2*VDD to 4*VDD in response to the clock signal CKH. This boost operation occurs when the control signal at node NB2 turns off pass transistor MN8 to isolate node NC2 from node NA2. The transistor MP4 functions as another pass transistor device to pass the boosted voltage at node NC2 to the output voltage node VOUT.

Figure 6:
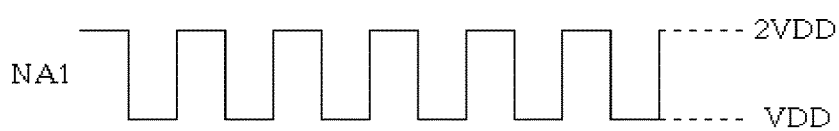
Figure 6:
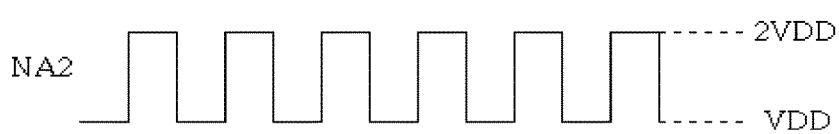

The voltage quadrupler circuit 100 operates as follows:

To begin, assume that the clocks are not running, and so the nodes NA1 and NA2 will be charged to substantially the VDD voltage level. Now, assume the clock signals CK and CKN are applied. With the clock signal CK at the 0 (ground GND) voltage level and the clock signal CKN at the VDD voltage level, the voltage at node NA1 remains at the VDD voltage level and the voltage at node NA2 is boosted to the 2*VDD voltage level through capacitor C2. The boosted voltage at node NA2 is sufficient to cause transistor MN1 to turn on and NA1 remains charged to the VDD voltage level. When the logic states of the clock signals CK and CKN change, the clock signal CK transitions to the VDD voltage level and the voltage at node NA1 is boosted through capacitor C1 to the 2*VDD voltage level. The boosted voltage at node NA1 is sufficient to cause transistor MN2 to turn on and node NA2 transitions to the VDD voltage. The voltage waveforms for the signals at nodes NA1 and NA2 are shown in FIG. 6.

When node NA1 is boosted to the 2*VDD voltage level, the transistor MP1 of inverter 102 turns on and the clock signal CKH transitions from the ground voltage level to the 2*VDD voltage level. At the same time, with the clock signal CKN at the ground voltage level, the transistor MN6 of the inverter 104 turns on and the clock signal CKHN transitions from the 2*VDD voltage level to the ground voltage level. When the logic states of the clock signals CK and CKN change, node NA2 is boosted to the 2*VDD voltage level and the transistor MP2 of inverter 104 turns on to drive the clock signal CKHN to the 2*VDD voltage level. At the same time, the clock signal CK is at the ground voltage level and transistor MN5 of the inverter 102 drive the clock signal CKH to the ground voltage level. The voltage waveforms for the clock signals are shown in FIGS. 4 and 5.

Figure 7:
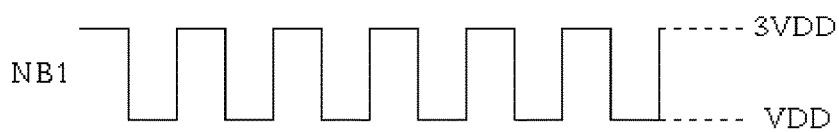
Figure 7:

The transition of node NA2 towards the 2*VDD voltage level causes the transistor MN3 to turn on and charge node NB2 and capacitor Cbs1 to the VDD voltage level (the clock signal CKHN being at the ground voltage level). With the previous logic state of the clock signal CKH at the ground voltage level, the node NB1 and capacitor Cbs2 were charged to the VDD voltage level. When the clock signal CKH now transitions to the 2*VDD voltage level, the node NB1 is boosted to the 3*VDD voltage level through the capacitor Cbs2. The transition of node NB1 towards the 3*VDD voltage level causes the transistor MN7 to turn on and charge node NC1 and capacitor C3 to the 2*VDD voltage level (the node NA1 being at the 2*VDD voltage level and the clock signal CKHN being at the ground voltage level). When the logic states of the clock signals CK and CKN change, the clock signal CKHN transitions to the 2*VDD voltage level and the node NB2 is boosted to the 3*VDD voltage level through the capacitor Cbs1 and transistor MN8 turns on to charge node NC2 and capacitor C4 to the 2*VDD voltage level (the node NA2 being at the 2*VDD voltage level and the clock signal CKH being at the ground voltage level). The voltage waveforms for the signals at nodes NB1 and NB2 are shown in FIG. 7.

Figure 8:
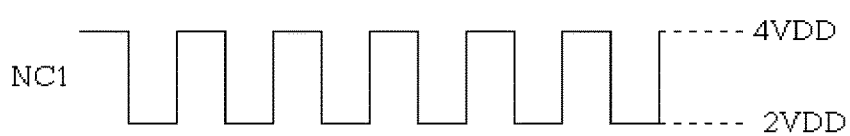
Figure 8:
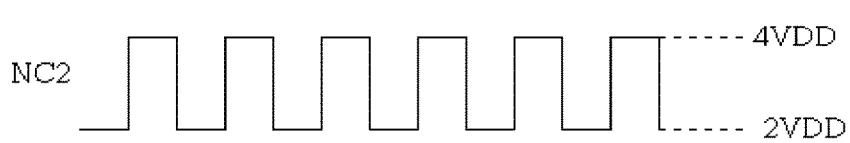

In the next clock cycle, when the clock CK transitions from the VDD voltage level to the ground voltage level, and thus the clock CKN transitions from the ground voltage level to the VDD voltage level, the clock signal CKHN will transition from the ground voltage level to the 2*VDD voltage level. The voltage at node NC1 is thus boosted to the 4*VDD voltage level through the capacitor C3. The 2*VDD voltage level at node NC2 turns on transistor MP3 and the 4*VDD voltage level is passed from node NC1 to the voltage output node VOUT. When the logic states of the clock signals CK and CKN change, the voltage at node NC2 is boosted to the 4*VDD voltage level through the capacitor C3 and transistor MP4 turns on to pass the 4*VDD voltage level from node NC2 to the voltage output node VOUT. The voltage waveforms for the signals at nodes NC1 and NC2 are shown in FIG. 8.

The voltage levels for the signals shown in FIGS. 4-8 are ideal voltage levels during operation of the circuit 100. It will be understood that the actual voltage levels of the signals shown in FIGS. 4-8 will not necessarily equal the ideal voltage levels. A simulation of the circuit of FIG. 3 reveals: a logic high voltage level for the clock signals CKH and CKHN of 3.95V with VDD at 2V; a logic high voltage level for the signals at nodes NA1 and NA2 of 3.95V; a logic high voltage level for the signals at nodes NB1 and NB2 of 5.91V; a logic high voltage level for the signals at nodes NC1 and NC2 of 7.87V; and a voltage at the voltage output node VOUT of 7.86V. It will be noted that the voltage at the voltage output node VOUT of 7.86V is substantially equal to the 7.89V produced by the prior art FIG. 2 circuit with a 2V input.

Figure 1:
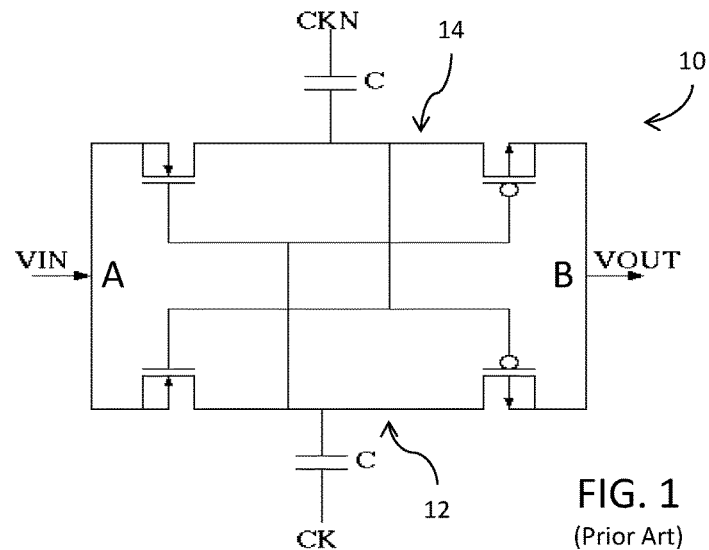
FIG. 1 is a circuit diagram of a prior art CMOS latch-based voltage doubler circuit.
Figure 2:
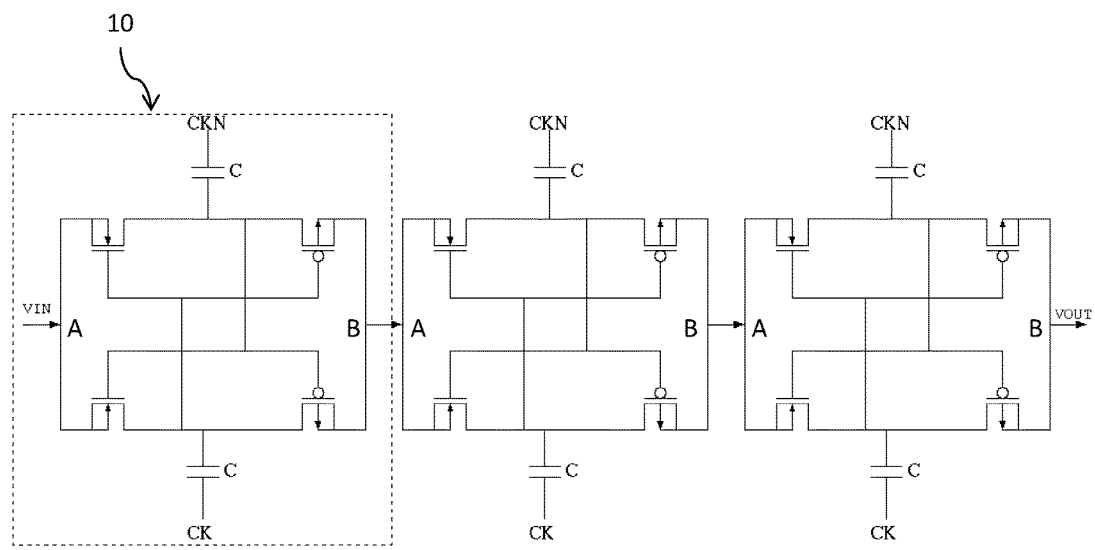
FIG. 2 is a circuit of a prior art voltage quadrupler circuit using three cascaded CMOS latch-based voltage doubler circuits.

The circuit 100 of FIG. 3 possesses at least the following advantages over the prior art FIG. 2 circuit: a) occupied area of the circuit is substantially less because only four large capacitors (as opposed to six in the prior art) are needed; and b) the need for a separate clock buffer for each stage is obviated because the FIG. 3 circuit needs only a single clock buffer to drive the CK and CKN clock signals.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A circuit, comprising:
a first transistor having a source-drain path coupled between a voltage input node and a first node;
a first boost capacitor having a first plate coupled to the first node and a second plate coupled to receive a first clock signal;
a first level shifting circuit configured to receive the first clock signal and output a level shifted first clock signal;
a second level shifting circuit configured to receive a second clock signal that is a logical invert of the first clock signal and output a level shifted second clock signal;
a second transistor having a source-drain path coupled between the voltage input node and a second node;
a first bootstrapping capacitor having a first plate coupled to the second node and a second plate coupled to receive the level shifted first clock signal;
a third transistor having a source-drain path coupled between the first node and a third node, said third transistor having a gate controlled by a first control signal at the second node; and
a second boost capacitor having a first plate coupled to the third node and a second plate coupled to receive the level shifted second clock signal;
wherein a gate of the first transistor and a gate of the second transistor are both driven by a second control signal.

2. The circuit of claim 1, further comprising a first output transistor configured to selectively pass a voltage at the third node to an output voltage node.

3. The circuit of claim 2, wherein the first, second and third transistors are of a first conductivity type and the first output transistor is of a second conductivity type opposite the first conductivity type.

4. The circuit of claim 1, further comprising:
a fourth transistor having a source-drain path coupled between the voltage input node and a fourth node; and
a third boost capacitor having a first plate coupled to the fourth node and a second plate coupled to receive the second clock signal;
said second control signal generated at the fourth node.

5. The circuit of claim 4, wherein a gate of the fourth transistor is driven by a third control signal generated at the first node.

6. The circuit of claim 4, further comprising:
a fifth transistor having a source-drain path coupled between the voltage input node and a fifth node; and
a second bootstrapping capacitor having a first plate coupled to the fifth node and a second plate coupled to receive the level shifted second clock signal.

7. The circuit of claim 6, wherein a gate of the fourth transistor and a gate of the fifth transistor are both driven by a third control signal generated at the first node.

8. The circuit of claim 6, further comprising:
a sixth transistor having a source-drain path coupled between the fourth node and a sixth node, said sixth transistor having a gate controlled by a fourth control signal generated at the fifth node; and
a fourth boost capacitor having a first plate coupled to the sixth node and a second plate coupled to receive the level shifted first clock signal.

9. The circuit of claim 8, further comprising:
a first output transistor configured to selectively pass a voltage at the third node to an output voltage node, said first output transistor having a gate driven by a fifth control signal generated at the sixth node; and
a second output transistor configured to selectively pass a voltage at the sixth node to the output voltage node, said second output transistor having a gate driven by a sixth control signal generated at the third node.

10. The circuit of claim 1, wherein the first level shifting circuit comprises:
a first level shifter transistor having a source-drain path coupled between the first node and a level shifted first clock signal output node; and
a second level shifter transistor having a source-drain path coupled between the level shifted first clock signal output node and a node receiving the first clock signal.

11. The circuit of claim 10, wherein gate terminals of the first and second level shifter transistors are both biased by a voltage at the voltage input node.

12. The circuit of claim 4, wherein the second level shifting circuit comprises:
a first level shifter transistor having a source-drain path coupled between the fourth node and a level shifted second clock signal output node; and
a second level shifter transistor having a source-drain path coupled between the level shifted second clock signal output node and a node receiving the second clock signal.

13. The circuit of claim 12, wherein gate terminals of the first and second level shifter transistors are both biased by a voltage at the voltage input node.

14. A circuit, comprising:
a first level shifting circuit configured to receive a first clock signal and output a level shifted first clock signal;
a second level shifting circuit configured to receive a second clock signal and output a level shifted second clock signal, wherein the second clock signal is a logical invert of the first clock signal;
a first voltage boosting circuit including a first capacitor having a first plate directly connected to a first node and a second plate coupled to receive the first clock signal, said first voltage boosting circuit configured to boost a voltage at the first node in response to the first clock signal from a first voltage level to a second voltage level that is substantially equal to two times the first voltage level;
a first pass transistor configured to selectively pass the boosted voltage at the first node to a second node in response to a first control signal generated in response to the level shifted first clock signal;
a second voltage boosting circuit including a second capacitor having a first plate directly connected to the second node and a second plate coupled to receive the level shifted second clock signal, said second voltage boosting circuit configured to boost a voltage at the second node in response to the level shifted second clock signal from the second voltage level to a third voltage level that is substantially equal to two times the second voltage level; and a first control circuit configured to generate said first control signal, said first control circuit comprising:
  a second transistor having a source-drain path coupled between the voltage input node and a third node, a gate of the second transistor controlled by said second control signal; and
  a first bootstrapping capacitor having a first plate coupled to the third node and a second plate coupled to receive the level shifted first clock signal.

15. The circuit of claim 14, wherein the first voltage boosting circuit further includes a first transistor having a source-drain path coupled between a voltage input node at the first voltage level and the first node, a gate of said first transistor controlled by a second control signal generated in response to the second clock signal.

16. The circuit of claim 14, further comprising:
  a third voltage boosting circuit including a third capacitor having a first plate directly connected to a fourth node and a second plate coupled to receive the second clock signal, said third voltage boosting circuit configured to boost a voltage at the fourth node in response to the second clock signal from the first voltage level to the second voltage level;
  a second pass transistor configured to selectively pass the boosted voltage at the fourth node to a fifth node in response to a third control signal generated in response to the level shifted second clock signal; and
  a fourth voltage boosting circuit including a fourth capacitor having a first plate directly connected to the fifth node and a second plate coupled to receive the level shifted first clock signal, said fourth voltage boosting circuit configured to boost a voltage at the fifth node in response to the level shifted first clock signal from the second voltage level to the third voltage level.

17. The circuit of claim 16, wherein the third voltage boosting circuit further includes a third transistor having a source-drain path coupled between a voltage input node at the first voltage level and the fourth node, a gate of said third transistor controlled by a fourth control signal generated in response to the first clock signal.

18. The circuit of claim 16, further comprising a second control circuit configured to generate said third control signal, said second control circuit comprising:
  a fourth transistor having a source-drain path coupled between the voltage input node and a sixth node, a gate of the fourth transistor controlled by said fourth control signal; and
  a second bootstrapping capacitor having a first plate coupled to the sixth node and a second plate coupled to receive the level shifted second clock signal.

19. A circuit, comprising:
  a first transistor having a source-drain path coupled between a voltage input node and a first node;
  a first boost capacitor having a first plate coupled to the first node and a second plate coupled to receive a first clock signal;
  a first level shifting circuit configured to receive the first clock signal and output a level shifted first clock signal;
  a second level shifting circuit configured to receive a second clock signal that is a logical invert of the first clock signal and output a level shifted second clock signal;
  a second transistor having a source-drain path coupled between the voltage input node and a second node;
  a first bootstrapping capacitor having a first plate coupled to the second node and a second plate coupled to receive the level shifted first clock signal;
  a third transistor having a source-drain path coupled between the first node and a third node, said third transistor having a gate controlled by a first control signal at the second node; and
  a second boost capacitor having a first plate coupled to the third node and a second plate coupled to receive the level shifted second clock signal;
  wherein the first level shifting circuit comprises:
    a first level shifter transistor having a source-drain path coupled between the first node and a level shifted first clock signal output node; and
    a second level shifter transistor having a source-drain path coupled between the level shifted first clock signal output node and a node receiving the first clock signal.

20. The circuit of claim 19, further comprising a first output transistor configured to selectively pass a voltage at the third node to an output voltage node.

21. The circuit of claim 20, wherein the first, second and third transistors are of a first conductivity type and the first output transistor is of a second conductivity type opposite the first conductivity type.

22. The circuit of claim 19, further comprising:
  a fourth transistor having a source-drain path coupled between the voltage input node and a fourth node; and
  a third boost capacitor having a first plate coupled to the fourth node and a second plate coupled to receive the second clock signal;
  wherein a second control signal is generated at the fourth node, the second control signal coupled to a gate of the first transistor and a gate of the second transistor.

23. The circuit of claim 22, wherein a gate of the fourth transistor is driven by a third control signal generated at the first node.

24. The circuit of claim 22, further comprising:
  a fifth transistor having a source-drain path coupled between the voltage input node and a fifth node; and
  a second bootstrapping capacitor having a first plate coupled to the fifth node and a second plate coupled to receive the level shifted second clock signal.

25. The circuit of claim 24, wherein a gate of the fourth transistor and a gate of the fifth transistor are both driven by a third control signal generated at the first node.

26. The circuit of claim 24, further comprising:
  a sixth transistor having a source-drain path coupled between the fourth node and a sixth node, said sixth transistor having a gate controlled by a fourth control signal generated at the fifth node; and
  a fourth boost capacitor having a first plate coupled to the sixth node and a second plate coupled to receive the level shifted first clock signal.

27. The circuit of claim 26, further comprising:
  a first output transistor configured to selectively pass a voltage at the third node to an output voltage node, said first output transistor having a gate driven by a fifth control signal generated at the sixth node; and
  a second output transistor configured to selectively pass a voltage at the sixth node to the output voltage node, said second output transistor having a gate driven by a sixth control signal generated at the third node.

28. The circuit of claim 19, wherein gate terminals of the first and second level shifter transistors are both biased by a voltage at the voltage input node.

29. A circuit, comprising:
a first transistor having a source-drain path coupled between a voltage input node and a first node;
a first boost capacitor having a first plate coupled to the first node and a second plate coupled to receive a first clock signal;
a first level shifting circuit configured to receive the first clock signal and output a level shifted first clock signal;
a second level shifting circuit configured to receive a second clock signal that is a logical invert of the first clock signal and output a level shifted second clock signal;
a second transistor having a source-drain path coupled between the voltage input node and a second node;
a first bootstrapping capacitor having a first plate coupled to the second node and a second plate coupled to receive the level shifted first clock signal;
a third transistor having a source-drain path coupled between the first node and a third node, said third transistor having a gate controlled by a first control signal at the second node;
a fourth transistor having a source-drain path coupled between the voltage input node and a fourth node; and
a second boost capacitor having a first plate coupled to the third node and a second plate coupled to receive the level shifted second clock signal;
wherein the second level shifting circuit comprises:
a first level shifter transistor having a source-drain path coupled between the fourth node and a level shifted second clock signal output node; and
a second level shifter transistor having a source-drain path coupled between the level shifted second clock signal output node and a node receiving the second clock signal.

30. The circuit of claim 29, further comprising a first output transistor configured to selectively pass a voltage at the third node to an output voltage node.

31. The circuit of claim 30, wherein the first, second and third transistors are of a first conductivity type and the first output transistor is of a second conductivity type opposite the first conductivity type.

32. The circuit of claim 29, further comprising:
a third boost capacitor having a first plate coupled to the fourth node and a second plate coupled to receive the second clock signal;
wherein a second control signal is generated at the fourth node, the second control signal coupled to a gate of the first transistor and a gate of the second transistor.

33. The circuit of claim 32, wherein a gate of the fourth transistor is driven by a third control signal generated at the first node.

34. The circuit of claim 32, further comprising:
a fifth transistor having a source-drain path coupled between the voltage input node and a fifth node; and
a second bootstrapping capacitor having a first plate coupled to the fifth node and a second plate coupled to receive the level shifted second clock signal.

35. The circuit of claim 34, wherein a gate of the fourth transistor and a gate of the fifth transistor are both driven by a third control signal generated at the first node.

36. The circuit of claim 34, further comprising:
a sixth transistor having a source-drain path coupled between the fourth node and a sixth node, said sixth transistor having a gate controlled by a fourth control signal generated at the fifth node; and
a fourth boost capacitor having a first plate coupled to the sixth node and a second plate coupled to receive the level shifted first clock signal.

37. The circuit of claim 36, further comprising:
a first output transistor configured to selectively pass a voltage at the third node to an output voltage node, said first output transistor having a gate driven by a fifth control signal generated at the sixth node; and
a second output transistor configured to selectively pass a voltage at the sixth node to the output voltage node, said second output transistor having a gate driven by a sixth control signal generated at the third node.

38. The circuit of claim 29, wherein gate terminals of the first and second level shifter transistors are both biased by a voltage at the voltage input node.

39. A circuit, comprising:
a first transistor having a source-drain path coupled between a voltage input node and a first node;
a first boost capacitor having a first plate coupled to the first node and a second plate coupled to receive a first clock signal;
a first level shifting circuit configured to receive the first clock signal and output a level shifted first clock signal;
a second level shifting circuit configured to receive a second clock signal that is a logical invert of the first clock signal and output a level shifted second clock signal;
a second transistor having a source directly connected to the voltage input node and a drain directly connected to a second node;
a first bootstrapping capacitor having a first plate coupled to the second node and a second plate coupled to receive the level shifted first clock signal;
a third transistor having a source-drain path coupled between the first node and a third node, said third transistor having a gate controlled by a first control signal at the second node; and
a second boost capacitor having a first plate coupled to the third node and a second plate coupled to receive the level shifted second clock signal.

40. The circuit of claim 39, further comprising a first output transistor configured to selectively pass a voltage at the third node to an output voltage node.

41. The circuit of claim 40, wherein the first, second and third transistors are of a first conductivity type and the first output transistor is of a second conductivity type opposite the first conductivity type.

42. The circuit of claim 39, wherein a gate of the first transistor and a gate of the second transistor are both driven by a second control signal.

43. The circuit of claim 42, further comprising:
a fourth transistor having a source-drain path coupled between the voltage input node and a fourth node; and
a third boost capacitor having a first plate coupled to the fourth node and a second plate coupled to receive the second clock signal;
said second control signal generated at the fourth node.

44. The circuit of claim 43, wherein a gate of the fourth transistor is driven by a third control signal generated at the first node.

45. The circuit of claim 43, further comprising:
a fifth transistor having a source directly connected to the voltage input node and a drain directly connected to a fifth node; and a second bootstrapping capacitor having a first plate coupled to the fifth node and a second plate coupled to receive the level shifted second clock signal.

46. The circuit of claim 45, wherein a gate of the fourth transistor and a gate of the fifth transistor are both driven by a third control signal generated at the first node.

47. The circuit of claim 45, further comprising:
a sixth transistor having a source-drain path coupled between the fourth node and a sixth node, said sixth transistor having a gate controlled by a fourth control signal generated at the fifth node; and
a fourth boost capacitor having a first plate coupled to the sixth node and a second plate coupled to receive the level shifted first clock signal.

48. The circuit of claim 47, further comprising:
a first output transistor configured to selectively pass a voltage at the third node to an output voltage node, said first output transistor having a gate driven by a fifth control signal generated at the sixth node; and
a second output transistor configured to selectively pass a voltage at the sixth node to the output voltage node, said second output transistor having a gate driven by a sixth control signal generated at the third node.

49. The circuit of claim 39, wherein first level shifting circuit comprises:
a first level shifter transistor having a source-drain path coupled between the first node and a level shifted first clock signal output node; and
a second level shifter transistor having a source-drain path coupled between the level shifted first clock signal output node and a node receiving the first clock signal.

50. The circuit of claim 49, wherein gate terminals of the first and second level shifter transistors are both biased by a voltage at the voltage input node.

51. The circuit of claim 43, wherein second level shifting circuit comprises:
a first level shifter transistor having a source-drain path coupled between the fourth node and a level shifted second clock signal output node; and
a second level shifter transistor having a source-drain path coupled between the level shifted second clock signal output node and a node receiving the second clock signal.

52. The circuit of claim 51, wherein gate terminals of the first and second level shifter transistors are both biased by a voltage at the voltage input node.

* * * * *